United States Patent
Erez et al.

(10) Patent No.: US 8,464,135 B2
(45) Date of Patent: Jun. 11, 2013

(54) ADAPTIVE FLASH INTERFACE

(75) Inventors: Eran Erez, San Jose, CA (US); Steven Shisan Cheng, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 172 days.

(21) Appl. No.: 12/835,292

(22) Filed: Jul. 13, 2010

(65) Prior Publication Data

US 2012/0017138 A1 Jan. 19, 2012

(51) Int. Cl.
*G11C 29/00* (2006.01)
(52) U.S. Cl.
USPC .......................................... 714/773; 714/763
(58) Field of Classification Search
None
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 6,252,731 B1 | 6/2001 | Sloan et al. |
| 6,397,313 B1 | 5/2002 | Kasa et al. |
| 6,510,488 B2 | 1/2003 | Lasser |
| 6,873,939 B1 | 3/2005 | Zerbe et al. |
| 6,996,740 B2 | 2/2006 | Ro |
| 7,057,939 B2 | 6/2006 | Li et al. |
| 7,058,818 B2 | 6/2006 | Dariel |
| 7,246,274 B2 | 7/2007 | Kizer et al. |
| 7,310,247 B1 | 12/2007 | Lin et al. |
| 7,426,623 B2 | 9/2008 | Lasser |
| 7,472,318 B2 | 12/2008 | Fan et al. |
| 7,480,766 B2 | 1/2009 | Gorobets |
| 7,492,807 B1 | 2/2009 | Buchmann et al. |
| 7,493,457 B2 | 2/2009 | Murin |

(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.

(Continued)

*Primary Examiner* — Guerrier Merant
(74) *Attorney, Agent, or Firm* — Davis Wright Tremaine LLP

(57) ABSTRACT

A structure, and corresponding operating techniques, are presented for the internal controller to memory circuit interface for memory systems such a flash memory card or other similarly structured devices. The interface between the controller circuit and memory circuit (or circuits) includes a feedback process where the amount of error that arises due to controller-memory transfers is monitored and the transfer characteristics (such as clock rate, drive strength, etc.) can be modified accordingly. For example, in addition to transferring a set of data, the transmitting side also generates and transmits a corresponding hash value for the set of data. When the set of data is received on the other side, a hash value is also generated there and compared to the received hash value to determine if these was transmission error. If there is no error, the transfer rate could, for example, be increased, while if there were error, it could be decreased.

46 Claims, 13 Drawing Sheets

U.S. PATENT DOCUMENTS

| | | | |
|---|---|---|---|
| 7,502,254 | B2 | 3/2009 | Murin et al. |
| 7,613,931 | B2 | 11/2009 | Tonami et al. |
| 2002/0069318 | A1 | 6/2002 | Chow et al. |
| 2005/0154819 | A1 | 7/2005 | Conley et al. |
| 2005/0162948 | A1 | 7/2005 | Swanson et al. |
| 2005/0166110 | A1 | 7/2005 | Swanson et al. |
| 2005/0213393 | A1 | 9/2005 | Lasser |
| 2005/0268181 | A1 | 12/2005 | Murty et al. |
| 2007/0061502 | A1 | 3/2007 | Lasser et al. |
| 2007/0061581 | A1 | 3/2007 | Holtzman et al. |
| 2007/0061597 | A1 | 3/2007 | Holtzman et al. |
| 2007/0065119 | A1 | 3/2007 | Pomerantz |
| 2007/0089035 | A1 | 4/2007 | Alexander et al. |
| 2007/0091677 | A1 | 4/2007 | Lasser et al. |
| 2007/0094459 | A1 | 4/2007 | Suzuki et al. |
| 2007/0113030 | A1 | 5/2007 | Bennett et al. |
| 2007/0136623 | A1 | 6/2007 | Perego et al. |
| 2007/0180346 | A1 | 8/2007 | Murin |
| 2007/0220197 | A1 | 9/2007 | Lasser |
| 2007/0260808 | A1 | 11/2007 | Raines et al. |
| 2007/0268745 | A1 | 11/2007 | Lasser |
| 2007/0271495 | A1 | 11/2007 | Shaeffer et al. |
| 2007/0283081 | A1 | 12/2007 | Lasser |
| 2008/0104312 | A1 | 5/2008 | Lasser |
| 2008/0112255 | A1 | 5/2008 | Nygren |
| 2008/0155176 | A1 | 6/2008 | Sinclair et al. |
| 2008/0155177 | A1 | 6/2008 | Sinclair et al. |
| 2008/0155178 | A1 | 6/2008 | Sinclair et al. |
| 2008/0155227 | A1 | 6/2008 | Sinclair et al. |
| 2008/0155228 | A1 | 6/2008 | Sinclair et al. |
| 2008/0181000 | A1 | 7/2008 | Lasser |
| 2008/0244338 | A1 | 10/2008 | Mokhlesi et al. |
| 2008/0244367 | A1 | 10/2008 | Chin et al. |
| 2008/0250300 | A1 | 10/2008 | Mokhlesi et al. |
| 2009/0094482 | A1 | 4/2009 | Zilberman |
| 2009/0138646 | A1 | 5/2009 | Ware et al. |
| 2009/0155175 | A1 | 6/2009 | Alt |
| 2009/0271678 | A1 | 10/2009 | Schneider et al. |
| 2009/0321530 | A1 | 12/2009 | Harari et al. |
| 2010/0005219 | A1* | 1/2010 | Loughner et al. ............... 711/5 |
| 2010/0005375 | A1* | 1/2010 | Dell et al. ............... 714/807 |
| 2011/0161784 | A1* | 6/2011 | Selinger et al. ............... 714/768 |
| 2011/0239063 | A1 | 9/2011 | Zerbe et al. |

OTHER PUBLICATIONS

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Partition Management Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 61/142,620 entitled "Non-Volatile Memory and Method With Improved Block Management System," filed Jan. 5, 2009, 144 pages.

U.S. Appl. No. 12/642,584 entitled "Maintaining Updates of Multi-Level Non-Volatile Memory in Binary Non-Volatile Memory," filed Dec. 18, 2009, 76 pages.

U.S. Appl. No. 12/642,611 entitled "Non-Volatile Memory with Multi-Gear Control Using On-Chip Folding of Data," filed Dec. 18, 2009, 74 pages.

U.S. Appl. No. 12/642,649 entitled "Data Transfer Flows for On-Chip Folding," filed Dec. 18, 2009, 73 pages.

U.S. Appl. No. 12/642,728 entitled "Non-Volatile Memory and Method With Post-Write Read and Adaptive Re-Write to Manage Errors," filed Dec. 18, 2009, 70 pages.

U.S. Appl. No. 12/642,740 entitled "Non-Volatile Memory and Method With Atomic Program Sequence and Write Abort Detection," filed Dec. 18, 2009, 60 pages.

Notification of Transmittal of the International Search Report and the Written Opinion of the International Searching Authority, or the Declaration for International Application No. PCT/US2011/043648 mailed Nov. 30, 2011, 12 pages.

List of Pending Claims for International Application No. PCT/US2011/043648 filed Jul. 12, 2011, 11 pages.

* cited by examiner

Programming into Four States Represented by a 2-bit Code

ADAPTIVE FLASH INTERFACE

BACKGROUND

This application relates to the operation of re-programmable non-volatile memory systems, such as semiconductor flash memory, and, more specifically, to the internal interface between the memory system's controller and memory circuits.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

There is an ongoing effort to improve the performance of memory devices, by reducing power consumption as well as increasing device speed. As noted above, non-volatile memory devices are commonly formed of a controller circuit and one or more memory chips connected to each other over a bus structure. The settings of the controller/memory device interface, such as the voltage values and frequencies used, are typically set according to the expected worst case scenario in order to have sufficient safety margin in order to avoid device failure. Consequently, in most circumstances the interface is being operated in less than optimal conditions. As this interface can be a limiting factor in device performance, these is consequently room for improvement in the design of this interface.

SUMMARY OF THE INVENTION

According to a general aspect of the invention, a non-volatile memory system has a controller circuit, including a memory interface and logic circuitry, and a memory circuit, including an array of non-volatile memory cells, a controller interface, and logic circuitry. The memory system also includes a bus structure connected to the memory interface of the controller circuit and to the controller interface of the memory circuit for the transfer of data and commands between the controller and memory circuit. A feedback processing circuit is connected to the logic circuitry of the receiving one the controller and the memory circuit during a transfer of data between them to receive information on the amount of error occurring as a result of the transfer, and connected to one or both of the memory interface and the controller interface to adjust the characteristics of the transfer between them in response to the amount of error.

In other aspects, methods of operating a non-volatile memory system including a non-volatile memory circuit and a controller circuit are presented. A first hash value is generated from a data set in logic circuitry on a first of the controller circuit and the memory circuit. The data set and the first hash value are transmitted to a bus structure through an interface on the first of the controller circuit and the memory circuit and received from the bus structure through an interface on the second of the controller circuit and the memory circuit. A second hash value is then generated from the data set as received in logic circuitry on the second of the controller circuit and the memory circuit and the first hash value, as received, is then compared to the second hash value on the second of the controller circuit and the memory circuit. Based on the comparison of the first hash value as received and the second hash value by the logic circuitry on the second of the controller circuit and the memory circuit, the system determines whether to alter characteristics of the transfer, of data between the controller circuit and the memory circuit.

According to a further set of aspects, methods of operating a non-volatile memory system having a controller circuit and a memory circuit including an array of non-volatile memory cells are presented. A set of data is transferred from buffer memory on the controller through transmission circuitry on the controller to a bus structure connecting the controller to the memory circuit and the set of data is received from the bus structure through receiving circuitry on the memory circuit, where it is stored in buffer memory on the memory circuit. Without the data set being written into the array, the data set as stored in buffer memory on the memory circuit is transferred through transmission circuitry on the memory circuit to the bus structure and received from the bus structure through receiving circuitry on the controller. The data as received is then stored in buffer memory on the controller. The system subsequently adjusts characteristics of the transfer of data between the controller circuit and the memory circuit based upon amount of error the set of data as received and stored in the buffer memory on the controller.

Various aspects, advantages, features and embodiments of the present invention are included in the following description of exemplary examples thereof, which description should be taken in conjunction with the accompanying drawings. All patents, patent applications, articles, other publications; documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

FIG. 1 to FIG. 7 provide example memory systems in which the various aspects of the present invention may be implemented or illustrated.

Figure 8:
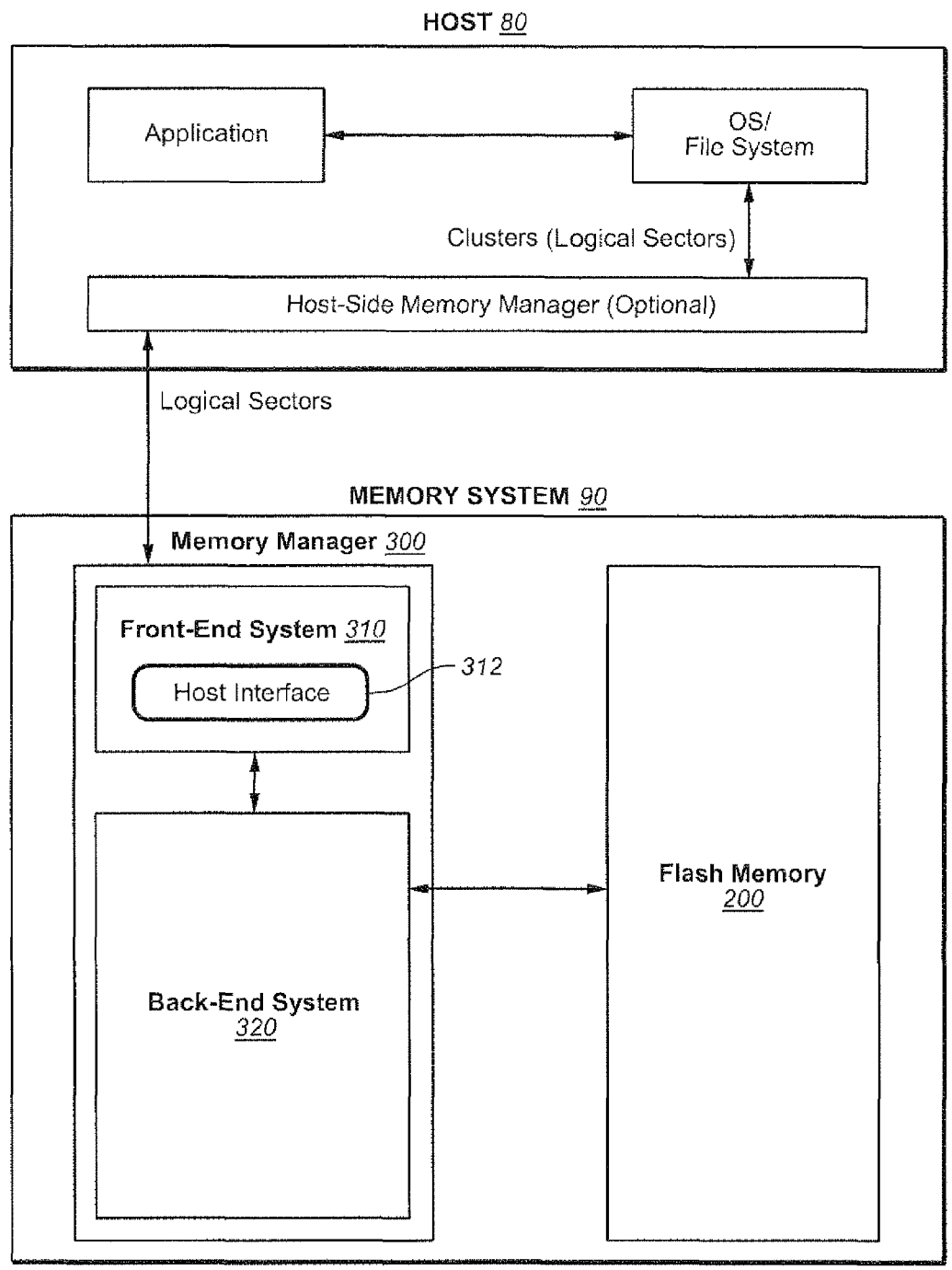
FIG. 8 illustrates the memory being managed by a memory manager with is a software component that resides in the controller.
Figure 9:
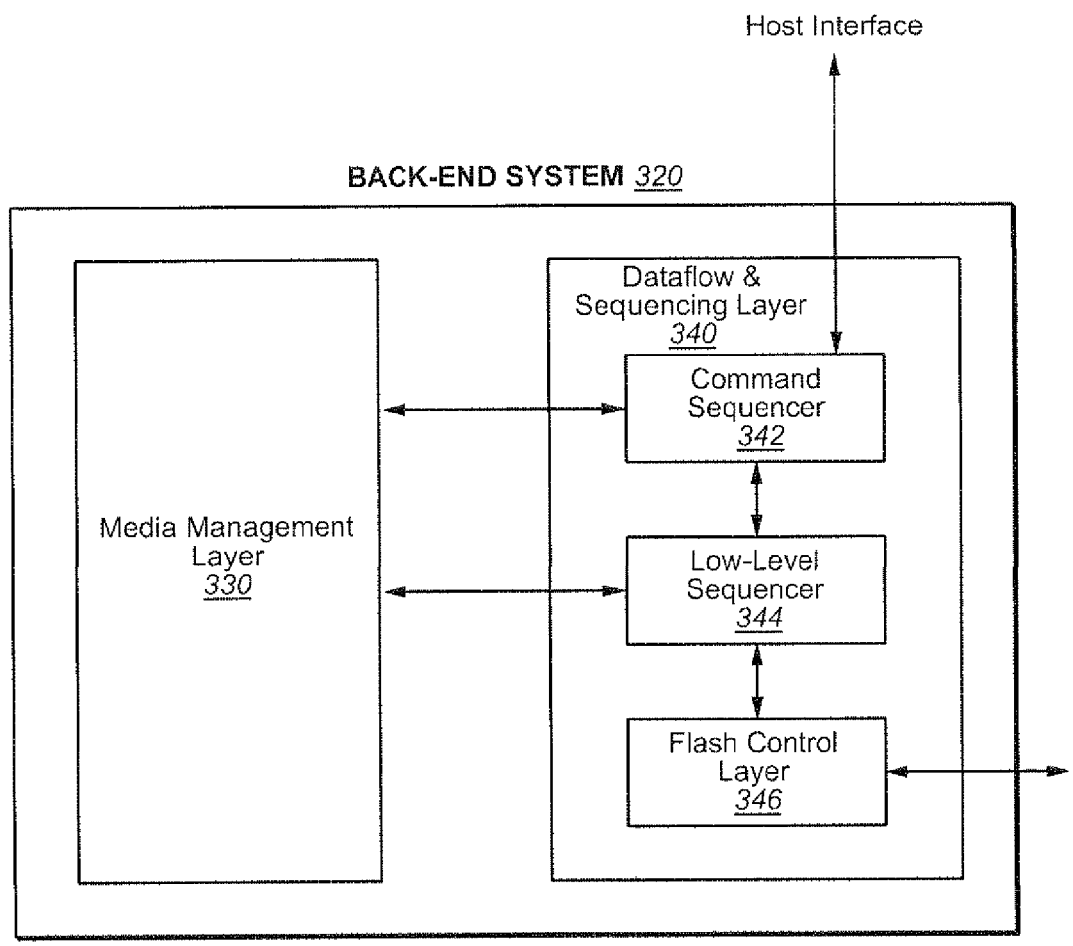
FIG. 9 illustrates the software modules of the back-end system.

FIG. 8 to FIG. 10 illustrate preferred memory and block architectures for implementing the various aspects of the present invention.

Figure 11:
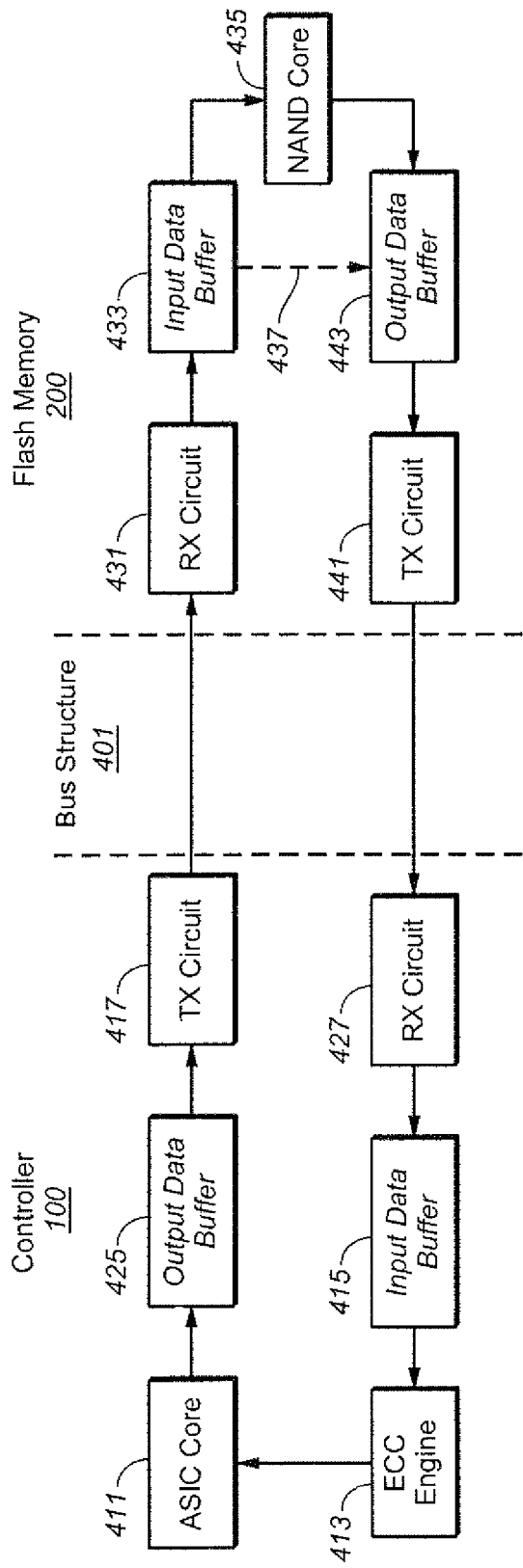
FIG. 11 is a block diagram showing a feedback mechanism for determining interface integrity based on an existing infrastructure.
Figure 13:
FIG. 13 is a diagram showing an example for transmitting the data and the generated hash value over the bus interface.
Figure 12:
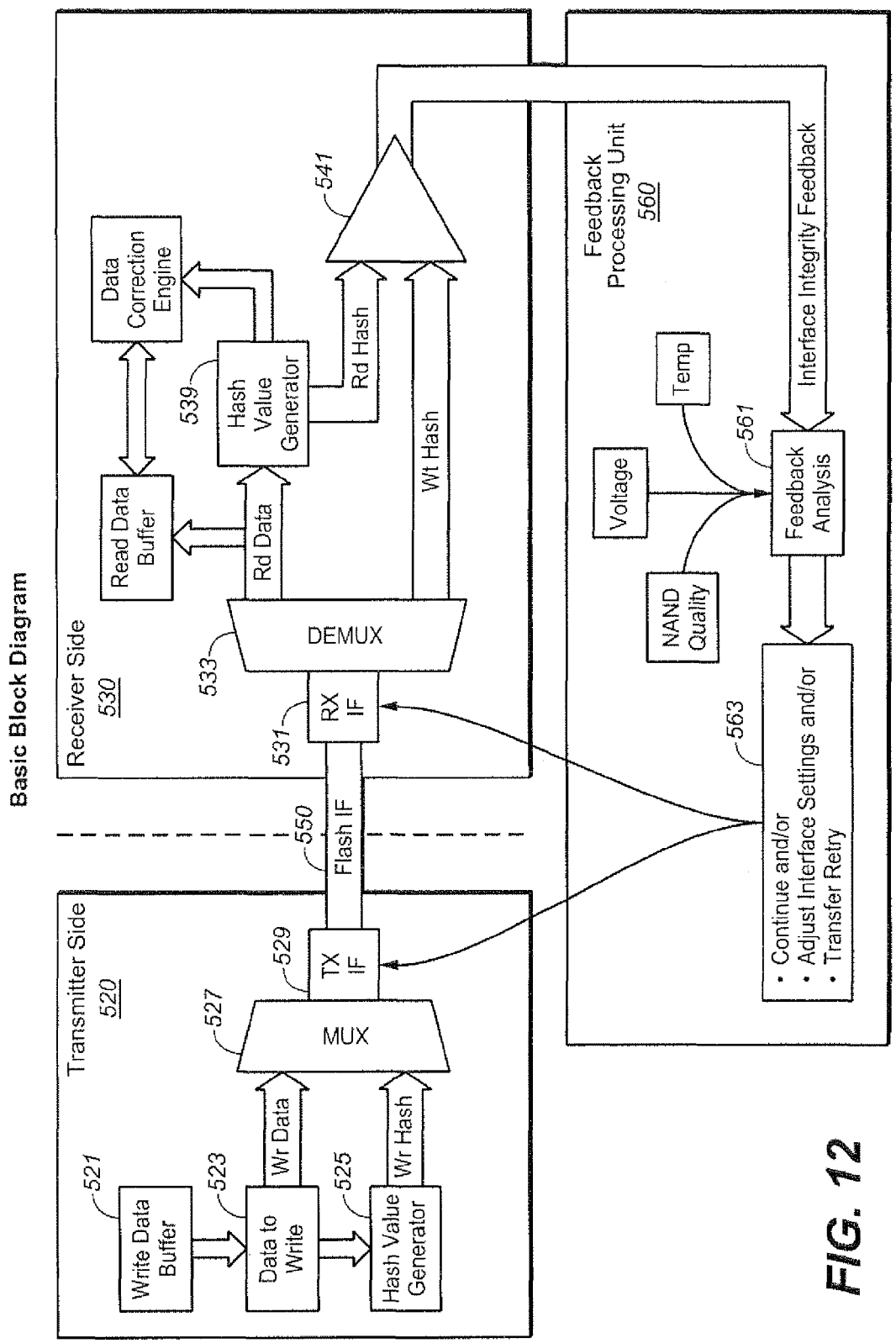
FIG. 12 is a block diagram illustrating embodiments where the feedback mechanism uses a hash engine to determine interface integrity.

FIGS. 11-13 illustrate the use of an adaptive internal interface between the controller and the memory circuit or circuits.

Figure 1:
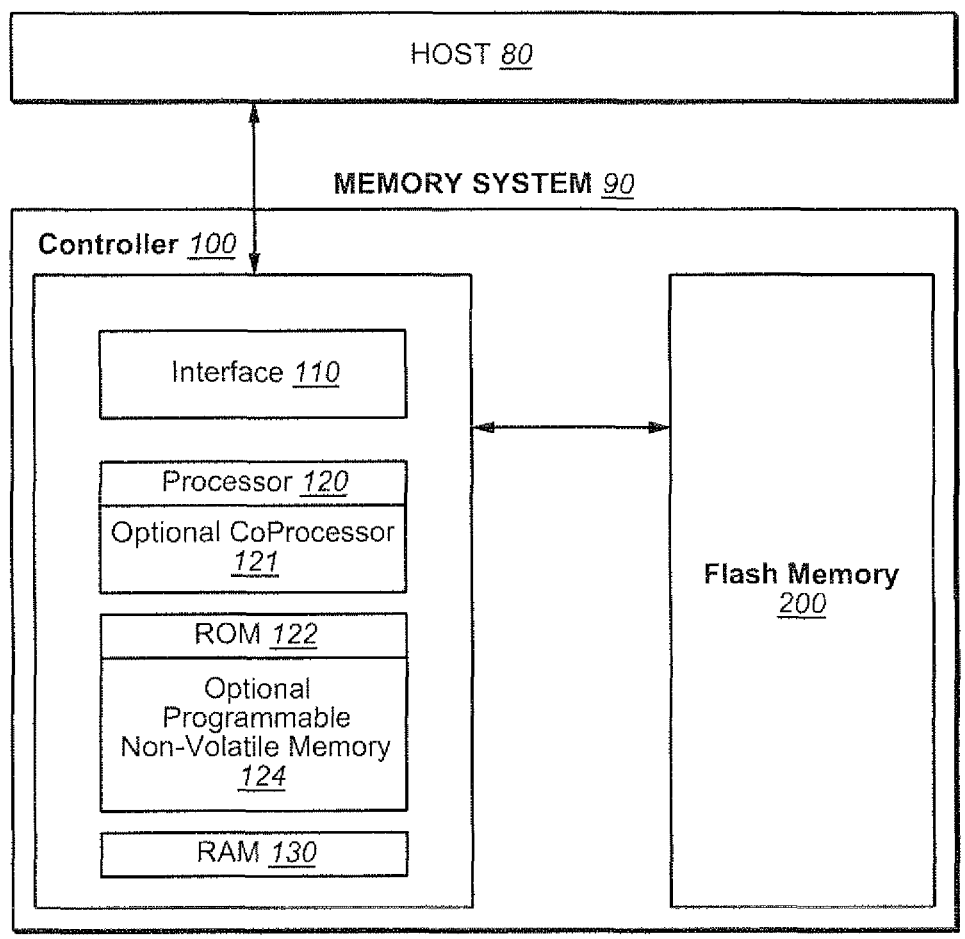
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
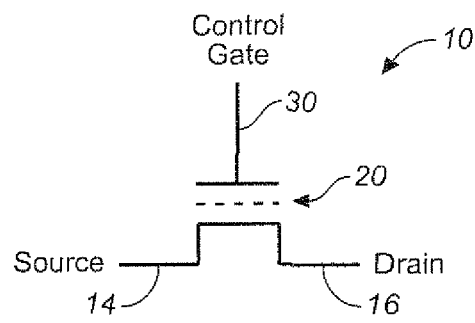
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
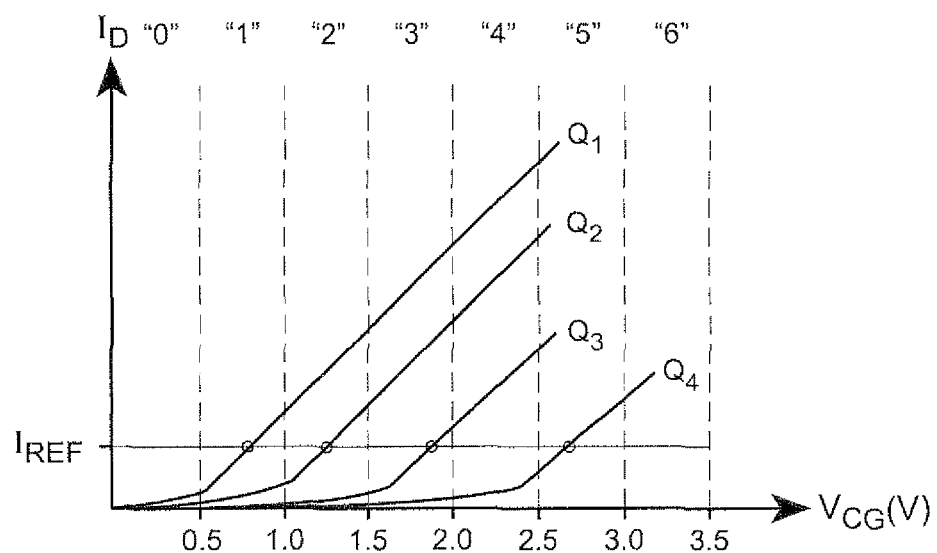
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, REF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from -1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
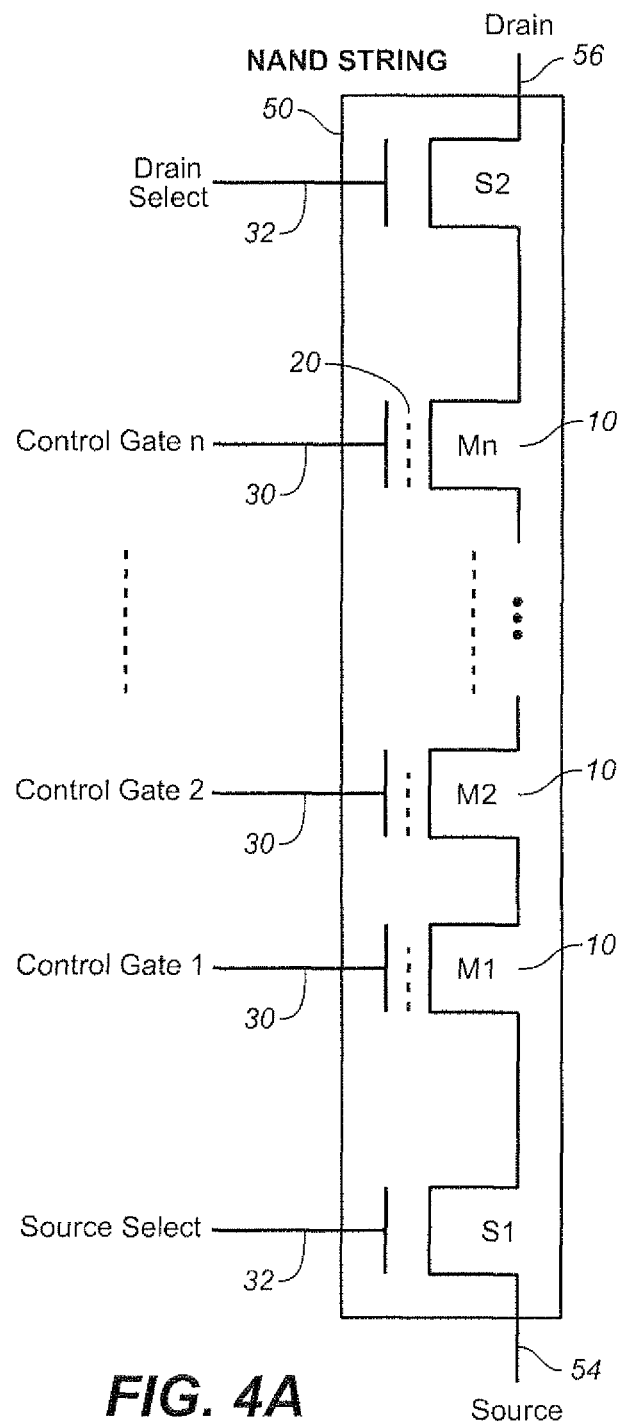
FIG. 4A illustrates schematically a string of memory cells organized into an NAND string.

FIG. 4A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
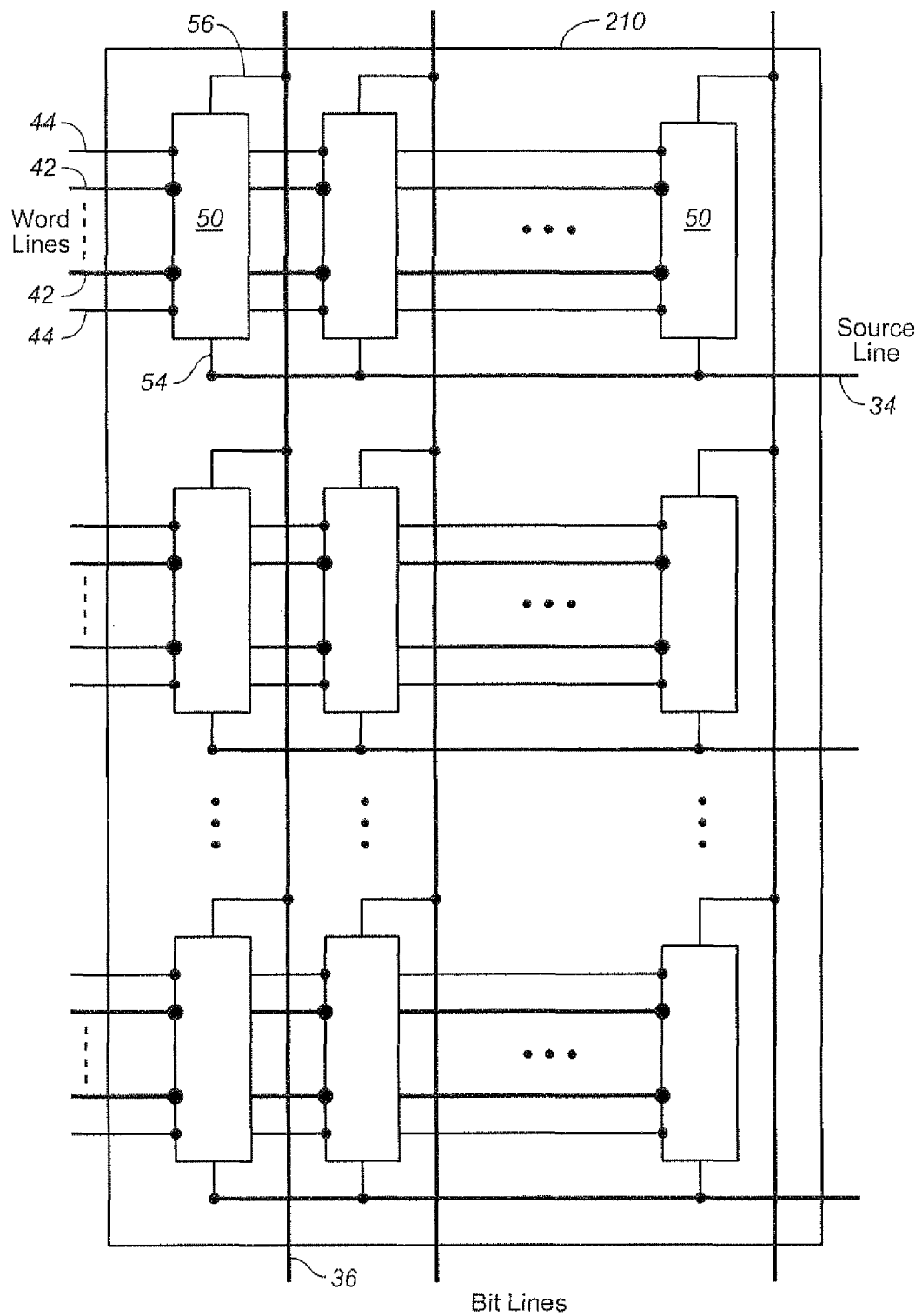
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
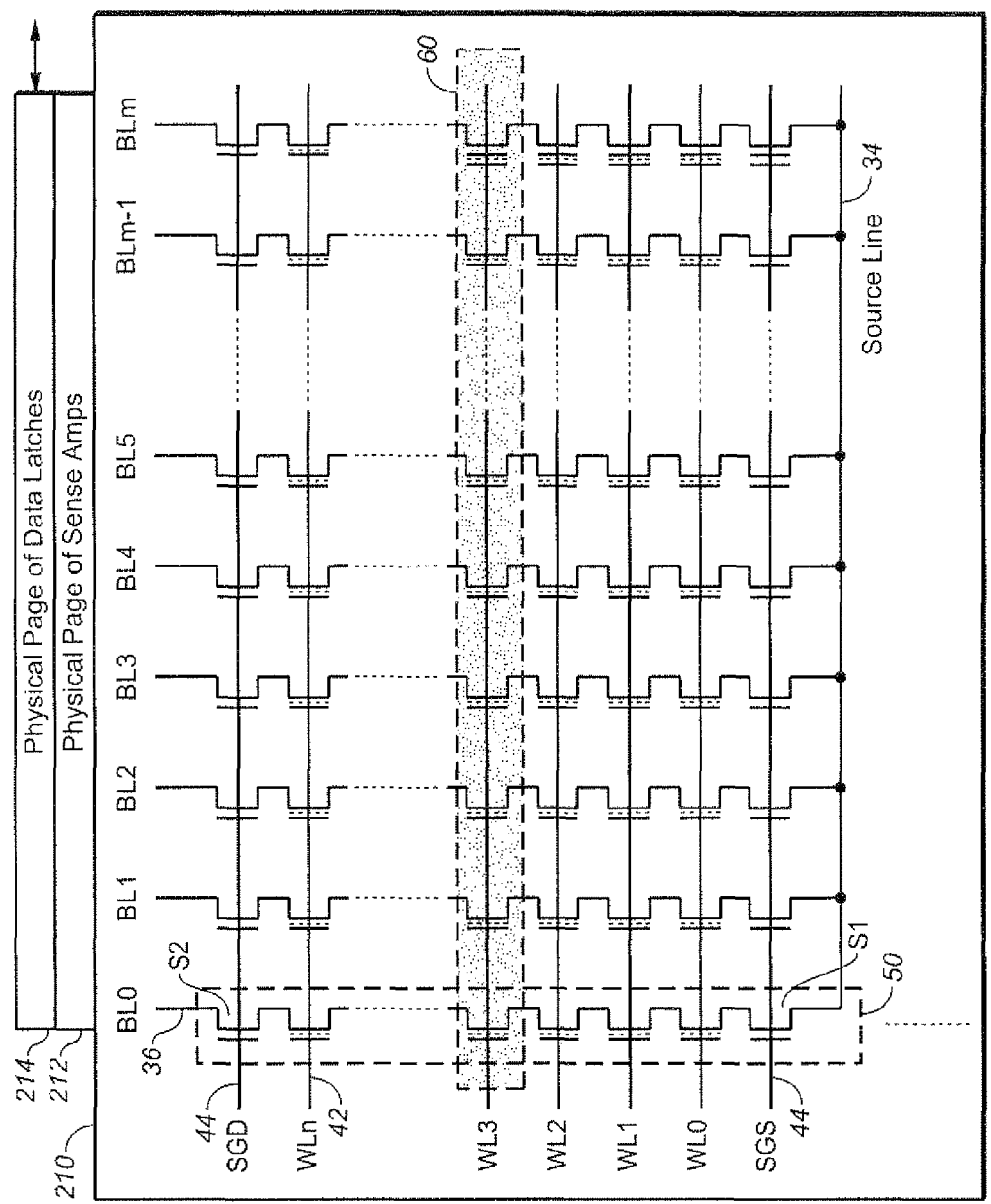
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
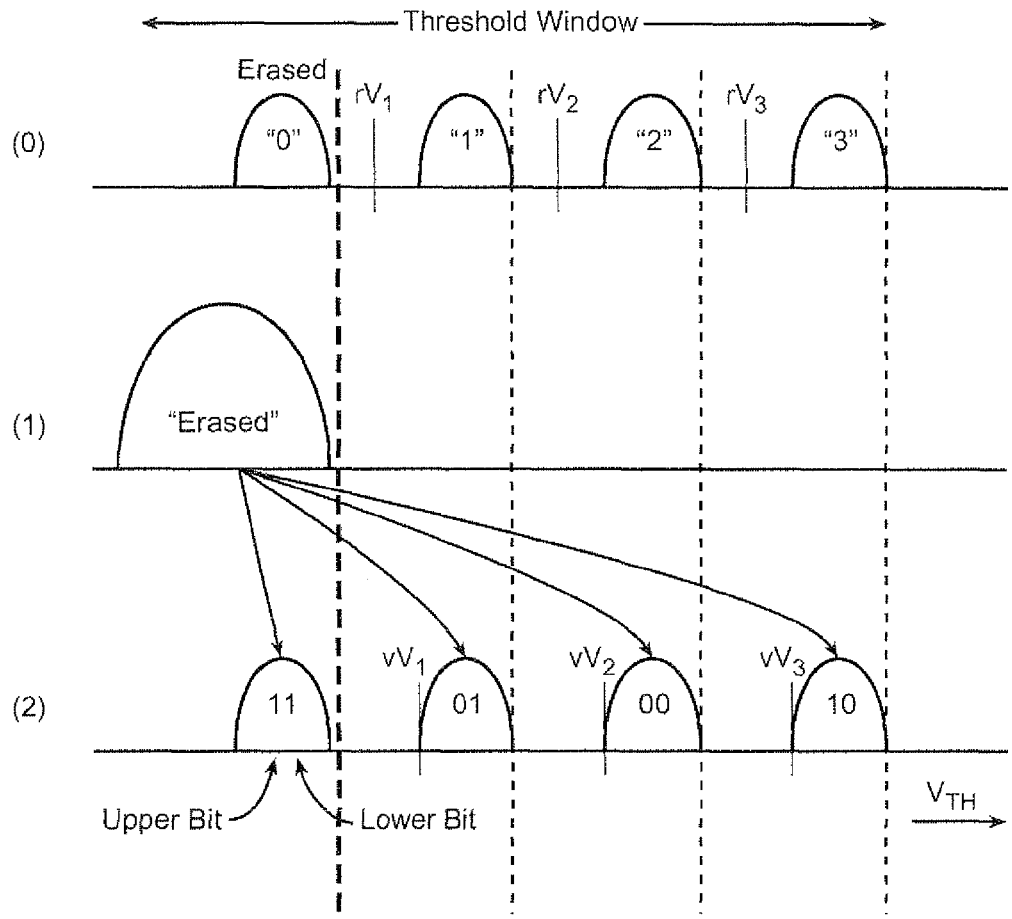
FIG. 6(0)-6(2) illustrate an example of programming a population of 4-state memory cells.

FIG. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
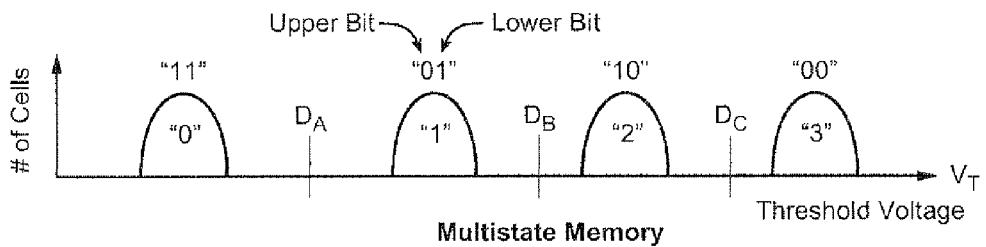
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
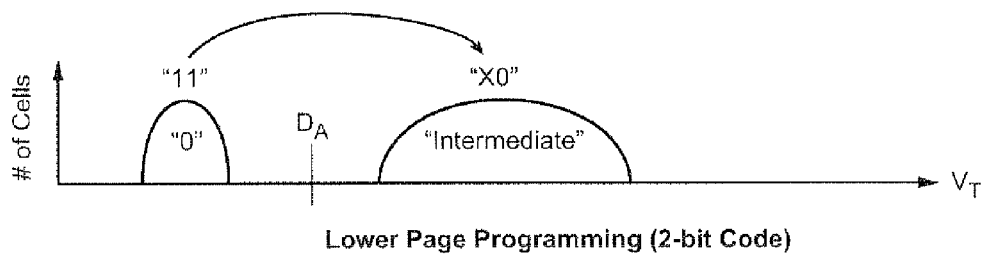

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
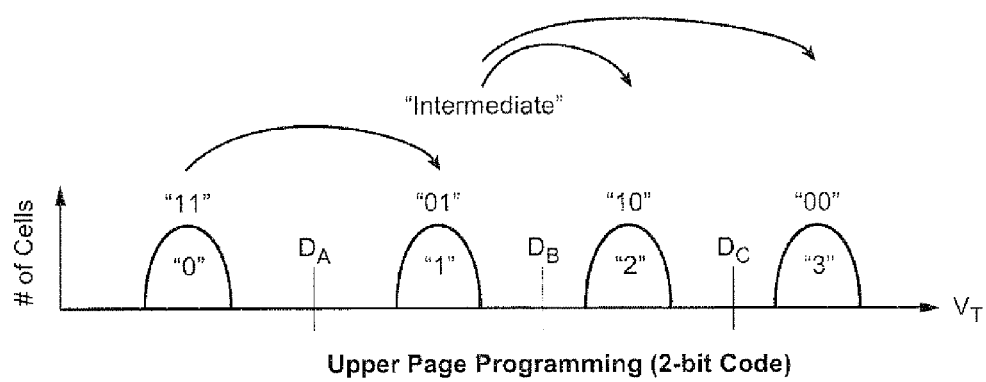

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
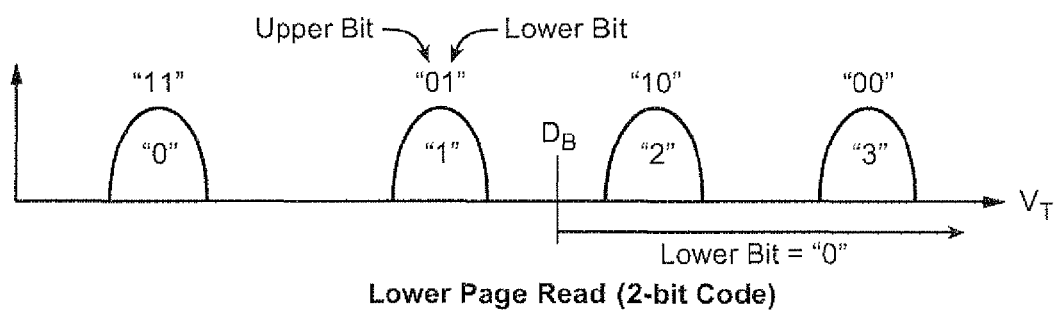

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
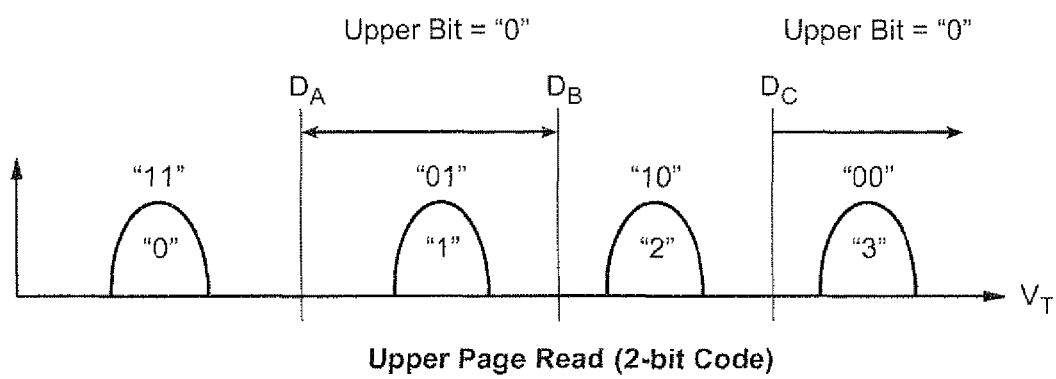

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
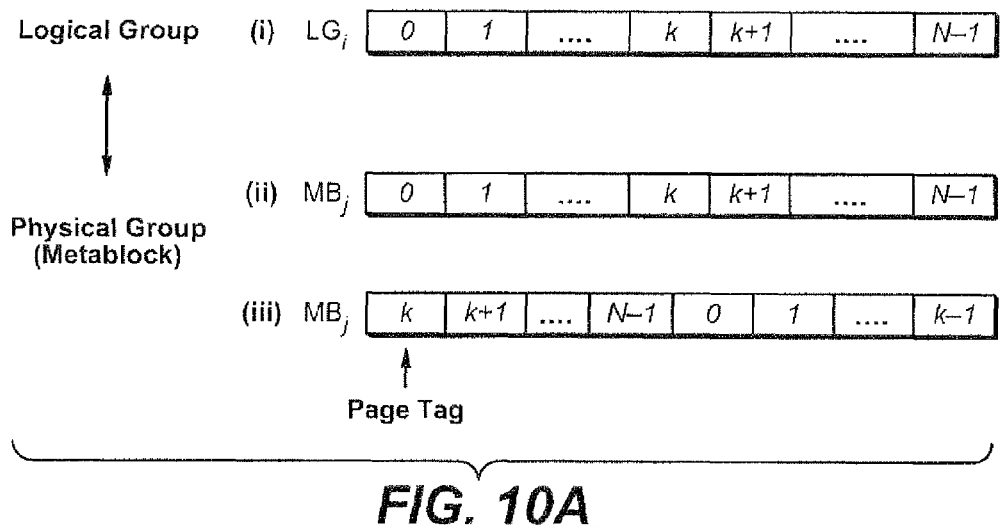
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
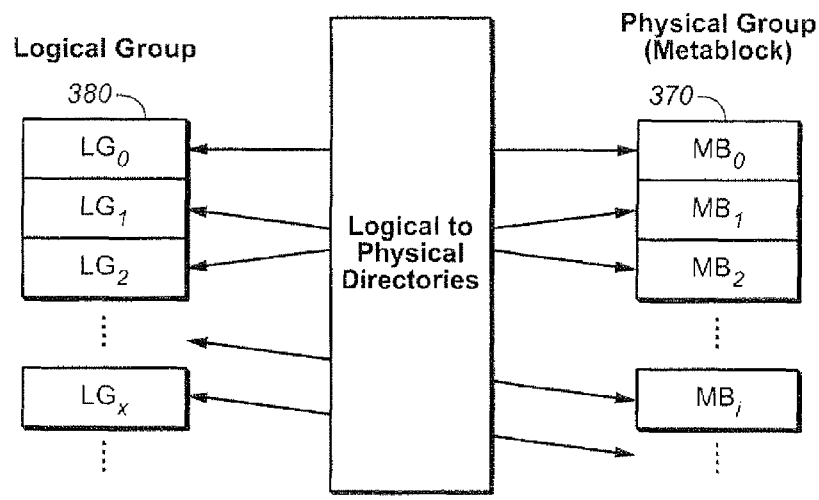
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Adaptive Controller-Memory Interface

This section presents the use of a feedback mechanism and processing unit that monitors transfer integrity of the internal controller-memory interface of the memory system and can adjust the interface settings accordingly. This allows for system to optimize interface performance. For example, the system's power may be able be reduced or the bus clock for the interface sped up, which, as this can often be an internal performance bottleneck, allows for an increase in performance as seen from outside of the memory system (i.e., from the host). In case of transmission errors, assisted by the interface integrity feedback and, depending on the embodiment, other sensors or parameters, the feedback processing unit can decide whether to adjust the interface settings, perform a transmission retry or to ignore the error. The discussion below will also be given in the context of a memory card using a NAND-type architecture for memory arrays as shown in FIGS. 4A, 4B and 5, but readily extends to similar internal interfaces for other architectures, other forms of memory and non-card uses, such as embedded systems, SSD, and so on.

Although the following discussion may be based on various exemplary embodiments to provide concrete examples, the techniques and structures here can be applied fairly generally to memory systems having a controller and multiple banks that can independently operated, where the banks include some amount of non-volatile memory, whether flash or other variety, that can be used to store system data that the controller can use to manage the memory system. In addition to the other referenced cited above, theses can include the various memory systems presented in the following US patent, patent publication and application numbers: U.S. Pat. No. 7,480,766; US-2005-0154819-A1; US-2007-0061581-A1; US-2007-9061597-A1; US-2007-0113030-A1; US-2008-0155178-A1; US-2008-0155228-A1; US-2008-0155176-A1; US-2008-0155177-A1; US-2008-0155227-A1; US-2008-0155175-A1; Ser. Nos. 12/348,819; 12/348,825; 12/348,891; 12/348,895; 12/348,899; 12/642,584; 12/642,611; 12/642,649; 12/642,728; 12/642,740; and 61/142,620.

Before discussion of the exemplary embodiment, this section will begin by further considering the problem being addressed. The controller-memory device interface is used to transfer data between a controller (100, FIG. 1) and one or more NAND (in the exemplary embodiment) devices (200, FIG. 1). (Note that this discussion relates to the internal interface on the memory system 90 between the controller 100 and the Flash memory 200, whereas the interface 110 is the host interface that the controller uses for communication with outside of the memory system.) Different NAND interface modes have been developed to increase the interface performance trading off speed, power consumption, and so on. As this interface is often a performance bottleneck, these interfaces are pushed to the limits to maximize system performances. To avoid data error, interface settings (such as voltage, frequency, drive strength and slew rate control) are being set for worst case scenario (extreme temperatures, extreme load capacitances, extreme voltages, and so on). Consequently, devices are typically designed to have worst-case safety margins, which translates to big margins in typical conditions. In such typical conditions the interface settings can be optimized to much higher interface performances without compromising the product reliability. Without a mechanism such as is presented in the following, memory devices will continue to operate in the worst-case performances settings.

For example, a simple comparison between the burst data transfer times for a 16-bit Normal Mode at the nominal bus frequency of 33 MHz to the accelerated 40 MHz, to the hyper-accelerated 50 MHz and the super hyper-accelerated 60 MHz yields significant latency reductions of about 17%, 33% and 45%, respectively This is shown in Table 1, where the columns are the frequency, corresponding cycle ($t_{cyc}$), time transfer 2142 Bytes of data, and speed ratio relative to that at 33 MHz.

TABLE 1

| Freq | $t_{cyc}$ | 2142B xfr time | Ratio |
|---|---|---|---|
| 33 MHz | 30.3 ns | 32454.5 ns | 1.00 |
| 40 MHz | 25.0 ns | 26775.0 ns | 0.83 |
| 50 MHz | 20.0 ns | 21420.0 ns | 0.66 |
| 60 MHz | 16.7 ns | 17850.0 ns | 0.55 |

In the prior art, Flash interface performance is typically set to a fixed performance for a given product. The design then takes into account the worst-case design. In some products, the Flash interface is designed for a "close to worst-case", allowing some interface performance optimization, but at the risk for some lower device yield or increased data error.

This section presents a feedback mechanism and processing unit that monitors the interface transfer integrity and adjusts the interface settings accordingly in order to optimize interface performance. In case of transmission errors, the feedback processing unit (assisted by the interface integrity feedback and possibly by other sensors or parameters) can decide whether to adjust the interface settings, perform a transmission retry or to ignore the error. In case of no transmission errors, the feedback processing unit may decide to leave interface settings as they are or modify interface settings in order increase the interface performance. Additionally, the interface integrity feedback mechanism can be designed in such a way that the feedback processing unit can get different grades of information, such as a binary pass/fail indication, a pass/fail plus number of errors, or a pass/fail plus number of errors plus error locations.

According to the embodiment, the feedback mechanism can utilize existing device infrastructure or be further optimized by dedicated mechanism such as hash engine. Such dedicated mechanism may be implemented in hardware, software, or a combination of these. The hash engine may also be complemented by an error correction engine capable of correcting transmission errors. Such method would allow the interface to cope with a level of bit error rate, while still reaching optimal performance. Transmission correction ability is valuable because the design of ECC in the prior art for NAND bit failures only considers errors on the memory itself, and does not take into account the interface errors that may occur as the data is transferred between the controller and the memory device. As interface performance goes up the likelihood of transmission errors goes up. Having the legacy ECC to deal with interface errors degrade the legacy ECC capabilities in terms of performance and probability for unrecoverable error. Designing a dedicated interface error correction engine can allow for a "divide and rule", letting the legacy ECC to focus only on the NAND generated errors. (Additional background detail on ECC can be found in the following US patents, patent publications, and patent application numbers: 2009/0094482; U.S. Pat. No. 7,502,254; 2007/0268745; 2007/0283081; U.S. Pat. Nos. 7,310,347; 7,493,457; 7,426,623; 2007/0220197; 2007/0065119; 2007/0061502; 2007/0091677; 2007/0180346; 2008/0181000; 2007/0260808; 2005/0213393; U.S. Pat. Nos. 6,510,488; 7,058,818; 2008/0244338; 2008/0244367; 2008/0250300; and 2008/0104312.)

FIG. 11 is a block diagram showing such a feedback mechanism, but based on a typical prior art existing NAND/controller infrastructure. This will help to further illustrate some of the concepts involved as well as providing an alternate embodiment of an adaptive interface. In FIG. 11 only the elements relevant to the present discussion are explicitly shown, the other being suppressed to simply the present discussion. On the controller 100 are the ASIC core 411, ECC circuitry 413, an output buffer 415, an input buffer 425, transmitting circuitry 417, and receiving circuitry 427. Although shown as separate here, this may not be so in an actual implementation: the input and output buffers may be overlap or be the same; the transmitting and receiving be share elements of even be the same; the ECC circuitry may be implemented as software in the ASIC core; and so on. On the memory side 200, the shown elements are read circuitry 431 and transfer circuitry 441 (which again may partially or completely overlap), an input data buffer 433 and an output data buffer 443 (which may similarly be a single buffer) and NAND core 435. The controller 100 and the memory circuit are then connected by the bus structure 401.

A typical flow for a set of host data once it is received at the controller 100 is from the ASIC core 411 to the output data buffer 415, through the transmission circuitry 417 and onto the bus structure 401. On the memory 200 the data is transferred from the bus by the receiving circuitry 431 into the input data buffer 433 and then written into the NAND core 435. Subsequently, when the host wants to access the data it is read out of the NAND core 435 to the output data buffer 443, transferred onto the bus structure 401 by the transmission circuitry 441, and then read off the bus into the controller's input data buffer 425 by the receiving circuitry 427. Memory systems typically use error correction code (ECC) to detect and correct for error that may enter the data, where the controller generates the corresponding ECC that is transmitted and written into the NAND core along with the data and then read back with the data. The ECC engine 413 then has access to the data and its corresponding ECC, allowing the data to be checked and corrected as needed before it is passed on to the host.

Although the ECC can be used to correct data error, it can only correct a limited amount of error, where the amount is a design choice. Within these capabilities, the ECC engine 413 can correct for any error accumulated during the round trip, including transmission errors as well as error associated with the NAND core 435 itself, such as write error, read error and disturbs and other degradation of the data while stored; however the choice of ECC is usually based just on considerations of error related to the NAND core 435. In some arrangements, such as with "strong ECC" as disclosed in some of the references cited above for ECC, the code is based on the properties of the memory and how the data states are mapping into the memory. The transmission between the controller and memory is largely overlooked and taken to add no error. Accordingly, the interface needs to be set accordingly, leading the parameters to be set according to the worst, or near worst, case, as described above.

A first set of embodiments is based on the elements of FIG. 11 to supply the feedback used to optimize the interface characteristics. A set of data, along with corresponding ECC, is sent on a round trip from the control to the memory and back to the controller, much as with the standard write followed by a read described above, except that the data (and corresponding ECC) are not actually written into the memory core. After a write transfer is being issued from the controller 100 to the memory circuit 200, the controller can use the buffer latches 433 and 443 to read back the data. This is represent by the path 437, although if the input and output buffers are the same, there would not be an actual transfer. As this round trip removes any error associated with the array of 435 itself, this isolates the effects of the transmission and allows the ECC engine 413 to determine the memory interface's integrity. The interface parameters may then be modified and the process can be re-issued. This way both the write and read interface parameters may be optimized.

FIG. 12 is a block diagram illustrating another set of embodiments, but where the feedback mechanism uses a hash engine and optional data correction engine specific to the interface. Rather than refer to the controller and the memory chip, FIG. 12 is presented in terms of the circuitry on the transmitter side 520 and the receiver side 530 since, as described further below, either one of these may be the controller and the other the memory depending on whether it is a read process or write process and the two sides need not be symmetric.

The transmitter side 520 will again include a write data buffer 521 and transmission interface circuitry 529. It will now also include a hash values generator 525 and a multiplexer 527. In a transfer process, the data to be written (523) is transferred out of the write buffer 520 to both the hash value generator 525 and the MUX 527. The hash value generator 525 correspondingly generates a hash value from the data, which is also passed on to MUX 527. The multiplexer then supplies the data followed by its hash value to the transmission interface circuitry 529 and then onto the bus structure 550.

The receiver side again includes receiver interface circuitry and a read data buffer 535, plus some additional elements. After the read interface circuitry 532 takes the data and corresponding hash value off the bus 550, the de-multiplexing circuitry 533 separates the hash value from the data, the read data is sent to the buffer 535 and also to a receiver side hash value generator 539 that again generates a hash value from the data set. The receiver side generated hash value is then compared to the received hash value in the comparison circuitry 541. Depending on the embodiment, the result of the comparison can just determine whether these values match or further determine the amount of error due to the transfer process. A data correction engine 537 can also be included in some embodiments to correct interface errors without having to perform a data retransmission. In the exemplary embodiment, the hash generators (and the optional data correction engine on the receiver side) separate from ECC for used NAND core error, although there may be some overlap in circuitry; and, in fact, both may be implemented on the same logic circuitry of the controller but by different firmware code. (Although considered separate for this discussion, the two error detection/correction parts can also be interactive in a more general embodiment as described below.) Typically the hash value will be generated based on the entirety of the information being sent (user data, corresponding ECC, header information, etc.), but in alternate embodiments, it could be generated from just a portion by, say, stripping off the various overhead and just using the user data itself for generating the hash value.

FIG. 12 also includes feedback processing unit 560 connected to receive the output of the hash comparison circuitry 541. This feed back is then analyzed at 561, which, depending on the embodiment may consider one or more of temperature, supply voltage level, and the processing related quality of the NAND core. At 563 the results of this feedback can then be used to adjust the transmission process and is correspondingly connected to one or both of the transmission interface circuitry 529 and read interface circuitry 531. For a write operation (where the controller is the transmitter side), after a write transfer is issued from the controller to the memory device, the feedback processing unit may just read back the comparison of the generated hash values and by that determine the write-direction memory interface integrity. Based on this, interface write parameters may be modified and the process can be re-issued if desired. Symmetrically, the same operation may be employed to the read-direction where the memory is the transmitter side.

FIG. 13 is a diagram showing an example for transmitting the data and the generated hash value over the bus interface. As shown at top, the corresponding hash value is automatically appended to the data, so that these will be transmitted together when a device operates in this mode. In the second option, shown at bottom, the data payload is transmitted, the receiving side requests the corresponding hash value, which is then generated and transmitted. The data payload can be of predefined length or of random length. If data payload length is predefined then the hash value can be appended to the data, as in the first option, or sent on request. If data payload length is random, then the hash value can be send after issuing a specific command.

A number of variations are possible for the techniques and corresponding circuitry described with respect to FIG. 12. With respect the hash value engines and hash values, the hash engine may be parity code (cyclic redundancy check, or CRC), ECC, and so on. For example, a "binary" embodiment can be used that would return Pass/Fail, can be built based on Error Bit Count (CRC) and has the benefit of a low gate count to implement. Alternately, a "soft" embodiment can an return Error Bit Count (EBC), and optionally the locations of the failed bits, and can be built based on ECC codes such BCH or Reed-Solomon codes, providing more information to assist the system with accurate decisions. The hash engine may optionally also have a complementary feature of correcting the interface failures, for example similarly to the correcting flipped bits from the memory core, as represented by data correction engine 537 of FIG. 12. Based on the feedback from the transfer, the system may repeat the transfer. Transfer retry may be decided based on a binary transfer status or on a soft transfer status. Further, transfer retry may be decided based on a combination of transfer status and number of NAND bit flips; for example, if the interface introduced N errors and the NAND introduced M errors and the controller error correcting capability is P, and P>N+M, then the system may decide to not re-transmit.

The system can also be configured in various different ways. The configuration can be symmetric, where the hash engines at controller and memory sides are the same, or asymmetric. In an asymmetric configuration, different configurations are used for different transmission directions; for example, a faster mechanism can be designed for read transmissions while a more reliable mechanism is designed for the write transmissions. Also, it should be noted that even if the interface is configured symmetrically, as the settings may be changed during the interval between the initial write and subsequent read of the data, it may function asymmetrically with respect to a given set of data.

The feedback processing unit 530 may be variously located on the controller 100, on the memory 200, on both, or distributed between the two. In can also be formed on a separate circuit. In many applications, it will be most practical to implement the feedback processing unit on the controller, since the controller circuit often includes more advanced processing capabilities and also as memory system frequently of formed of multiple memory chips, but the techniques presented here are not so limited. In any of these variations, the checking for data transfer status phase is the responsibility of the feedback processing unit.

Considering further an example where the feedback processing unit is located on the controller side: in the read direction, after the controller reads the data and hash value, these will pass through the feedback mechanism and the controller will determine the pass/fail status and can adjust (or not) the interface setting accordingly. As the controller has already read the data and hash value, there is no further need of information from the flash side to determine the status, as this can be done in the controller's logic. In the write direction, the data payload and corresponding hash value are sent to the memory side and the controller can then operate in several different ways: Read the Pass/Fail status from the memory side; read back the hash value and determine Pass/Fail; read back the Error Bit Count (EBC) from the memory; read back the EBC and error locations from the NAND; or read Pass/Fail status and number of corrected bits from the memory side.

The feedback processing unit may decide to modify interface settings. For example the following interface settings may be modified: drive strength; bus frequency or other timing parameters; interface voltage; interface mode (e.g. switch from a Normal/Conventional-mode to a Toggle-mode); and so on. These interface settings may then be modified in an adaptive feedback fashion. As factors such as process variations, supply voltage levels, and temperature affect the likelihood of interface error, these factors can also included as inputs to the feedback analysis 561 on FIG. 12.

The bus frequency and other parameter settings can be based on earlier remissions, with nominal parameter settings also being settable in various ways. For example, a Look Up Table (LUT) having different values for different bus capacitance/NAND configurations can be used. Such a Look Up Table (LUT) can also have different values for different operating process parameters, voltage supply levels, temperature, and so on. Process parameters, voltage supply levels, and temperature can also be a variable in a function (formula), instead of predefined in a LUT.

The interface settings optimization task may be operated in the background. Special events, such as voltage supply or temperature change, can also be used to trigger an interface settings training task. The interface training task may use also a known pattern transmitted across and not written to the NAND core, such as was described above with respect to FIG. 11 and path 437. Interface settings can also be different, and based on, read direction and write direction, or on different data retention requirements.

The preceding discussion has mainly considered the memory system as having a controller and a single memory device circuit. More generally, the system may include several memory chips that can be connected to the controller (and the feedback processing unit if a separate circuit) using various bus topologies. For example, all the memory chips may share a single system bus; or each memory circuit may have its own controller-memory bus; or various hybrid arrangements could be used. Different interface settings can then be applied to this plurality of NAND devices (e.g., if interfacing several devices, this could be done in parallel). Different interface setting can also be used based on the particular NAND device being accessed, as interface quality may be a function of the particular NAND device's load and/or cell/block quality). Further, within a given memory device, different interface setting can also be applied to the blocks within the NAND core, as interface quality may be a function of the particular block's quality.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A non-volatile memory system, comprising:
   a controller circuit, including a memory interface and logic circuitry;
   a memory circuit, including an array of non-volatile memory cells, a controller interface, and logic circuitry;
   a bus structure connected to the memory interface of the controller circuit and to the controller interface of the memory circuit for the transfer of data and commands therebetween; and
   a feedback processing circuit connected to the logic circuitry of the receiving one the controller and the memory circuit during a transfer of data therebetween to receive information on the amount of error occurring as a result of the transfer, and connected to one or both of the memory interface and the controller interface to adjust the characteristics of the transfer therebetween in response to the amount of error.

2. The non-volatile memory system of claim 1, wherein said transfer of data is from the controller circuit to the memory circuit.

3. The non-volatile memory system of claim 1, wherein said transfer of data is from the memory circuit to the controller circuit.

4. The non-volatile memory system of claim 1, wherein the logic circuitry of each of the controller and the memory circuit include a hash value generator,
wherein in the transfer process from the first one of the memory circuit and the controller to the second one thereof, the first transmits over the bus structure a data set and a first hash value generated from the data set by first one's logic circuit, and the second one receives from the bus structure the data set and the first hash value and generates from the received data set a second hash value from the data set by second one's logic circuit, and
wherein the logic circuitry of the second one of the memory circuit and the controller further includes comparison circuit connected to receive and perform a comparison of the first hash value as received and the second hash value, said amount of error being based on the result of the comparison.

5. The non-volatile memory system of claim 4, wherein the circuitry used for generating the respective hash values on the memory circuit and the controller are equivalent.

6. The non-volatile memory system of claim 4, wherein the circuitry used for generating the respective hash values on the memory circuit and the controller are not equivalent.

7. The non-volatile memory system of claim 1, wherein the comparison determines whether or not the first and second hash values are equal, and, in response to determining that the first and second values are not equal, the logic of circuitry of the second one of the memory circuit and the controller further quantifies the amount of error.

8. The non-volatile memory system of claim 1, wherein the feedback processing circuit is formed on the same integrated circuit as the controller.

9. The non-volatile memory system of claim 1, wherein the feedback processing circuit is formed on the same integrated circuit as the memory circuit.

10. The non-volatile memory system of claim 1, wherein the feedback processing circuit is formed on a separate integrated circuit from both of the controller and the memory circuit.

11. The non-volatile memory system of claim 1, wherein the memory circuit is formed of a plurality of integrated circuits, each including an array of non-volatile memory cells, a controller interface, and logic circuitry.

12. The non-volatile memory system of claim 11, wherein each integrated circuit of the memory circuit is connected to the controller by a distinct bus.

13. The non-volatile memory system of claim 11, wherein one or more of integrated circuit of the memory circuit are connected to the controller by a shared bus.

14. The non-volatile memory system of claim 11, wherein characteristics of the transfer between the controller and a plurality of the integrated circuits of the memory circuit can be independently adjusted.

15. A method of operating a non-volatile memory system including a controller circuit and a non-volatile memory circuit, the method comprising:

generating a first hash value from a data set in logic circuitry on a first of the controller circuit and the memory circuit;
transmitting to a bus structure the data set and the first hash value through an interface on the first of the controller circuit and the memory circuit;
receiving the data set and the first hash value from the bus structure through an interface on the second of the controller circuit and the memory circuit
generating a second hash value from the data set as received in logic circuitry on the second of the controller circuit and the memory circuit;
comparing the first hash value as received and the second hash value on the second of the controller circuit and the memory circuit; and
based on the comparison of the first hash value as received and the second hash value by the logic circuitry on the second of the controller circuit and the memory circuit, determining by feedback processing circuit on the non-volatile memory system of whether to alter characteristics of the transfer of data between the controller circuit and the memory circuit.

16. The method of claim 15, wherein the first of the controller circuit and the memory circuit is the controller circuit.

17. The method of claim 15, wherein the first of the controller circuit and the memory circuit is the memory circuit.

18. The method of claim 15, wherein the logic circuitry used for generating the respective hash values on the memory circuit and the controller are equivalent.

19. The method of claim 15, wherein the logic circuitry used for generating the respective hash values on the memory circuit and the controller are not equivalent.

20. The method of claim 15, wherein the characteristics of the transfer of data between the controller circuit and the memory circuit include a frequency at which data is transferred.

21. The method of claim 15, wherein the characteristics of the transfer of data between the controller circuit and the memory circuit include a clock frequency for the bus structure.

22. The method of claim 15, wherein the characteristics of the transfer of data between the controller circuit and the memory circuit include a slew rate used in the transfer.

23. The method of claim 15, wherein the characteristics of the transfer of data between the controller circuit and the memory circuit include an interface voltage at which data is transferred.

24. The method of claim 15, wherein the characteristics of the transfer of data between the controller circuit and the memory circuit include a drive strength at which data is transferred.

25. The method of claim 15, wherein the hash values are built based on a cyclic redundancy check.

26. The method of claim 15, wherein the hash values are built based on an error correction code.

27. The method of claim 15, wherein prior transmitting the data set and the first hash value through the interface on the first of the controller circuit and the memory circuit, the characteristics of the transfer of data are set to an initial set of values determined from a look up table based upon the characteristics of the bus structure and the memory circuit of the memory system.

28. The method of claim 15, wherein prior transmitting the data set and the first hash value through the interface on the first of the controller circuit and the memory circuit, the characteristics of the transfer of data are set to an initial set of values determined from a look up table based upon one or more parameters.

29. The method of claim 15, wherein prior transmitting the data set and the first hash value through the interface on the first of the controller circuit and the memory circuit, the characteristics of the transfer of data are set to an initial set of values determined from the quality of a previous transmission of data between the controller circuit and the memory circuit.

30. The method of claim 28, wherein the one or more parameters include a supply voltage level.

31. The method of claim 28, wherein the one or more parameters include a temperature.

32. The method of claim 28, wherein the one or more parameters include processing values for one or both of the controller circuit and the memory circuit.

33. The method of claim 15, the generating and transmitting of the first hash value is in response to a request from one of the controller circuit and the memory circuit.

34. The method of claim 15, further comprising:
in response to said determining, altering the characteristics of the transfer of data between the controller circuit and the memory circuit, wherein the altering is done symmetrically with respect to transfers from the controller circuit to the memory circuit and transfers from the memory circuit to the controller circuit.

35. The method of claim 15, further comprising:
in response to said determining, altering the characteristics of the transfer of data between the controller circuit and the memory circuit, wherein the altering is done asymmetrically with respect to transfers from the controller circuit to the memory circuit and transfers from the memory circuit to the controller circuit.

36. A method of operating a non-volatile memory system having a controller circuit and a memory circuit including an array of non-volatile memory cells, the method comprising:
transferring a set of data from buffer memory on the controller through transmission circuitry on the controller to a bus structure connecting the controller to the memory circuit;
receiving the set of data from the bus structure through receiving circuitry on the memory circuit;
storing the set of data as received in buffer memory on the memory circuit;
transferring the set of data as stored in buffer memory on the memory circuit, and without being written into the array, through transmission circuitry on the memory circuit to the bus structure;
receiving the set of data from the bus structure through receiving circuitry on the controller;
subsequently storing the set of data as received in buffer memory on the controller; and
subsequently adjusting by the memory system of characteristics of the transfer of data between the controller circuit and the memory circuit based upon amount of error in the set of data as received and stored in the buffer memory on the controller.

37. The method of claim 36, wherein the amount of error is determined by ECC circuitry on the controller.

38. The non-volatile memory system of claim 1, wherein the memory system is a memory card.

39. The non-volatile memory system of claim 1, wherein the memory system is an embedded memory system.

40. The non-volatile memory system of claim 1, wherein the memory system is an SSD.

41. The method of claim 15, wherein the memory system is a memory card.

42. The method of claim 15, wherein the memory system is an embedded memory system.

43. The method of claim 15, wherein the memory system is an SSD.

44. The method of claim 36, wherein the memory system is a memory card.

45. The method of claim 36, wherein the memory system is an embedded memory system.

46. The method of claim 36, wherein the memory system is an SSD.

* * * * *